(12) United States Patent
Min et al.

(10) Patent No.: US 10,734,054 B2
(45) Date of Patent: Aug. 4, 2020

(54) MAGNETIC STRUCTURE BASED ON SYNTHETIC ANTIFERROMAGNETIC FREE LAYER AND DERIVATIVE SOT-MRAM

(71) Applicant: XI'AN JIAOTONG UNIVERSITY, Xi'an, Shaanxi (CN)

(72) Inventors: Tai Min, Shaanxi (CN); Xue Zhou, Shaanxi (CN); Xuesong Zhou, Shaanxi (CN); Lei Wang, Shaanxi (CN)

(73) Assignee: XI'AN JIAOTONG UNIVERSITY, Xi'an Shaanxi (CN)

( * ) Notice: Subject to any disclaimer, the term of this patent is extended or adjusted under 35 U.S.C. 154(b) by 0 days.

(21) Appl. No.: 16/575,240

(22) Filed: Sep. 18, 2019

(65) Prior Publication Data

US 2020/0013444 A1 Jan. 9, 2020

(30) Foreign Application Priority Data

Sep. 18, 2018 (CN) .......................... 2018 1 1088726

(51) Int. Cl.
| | |
|---|---|
| *G11C 11/16* | (2006.01) |
| *H01F 10/32* | (2006.01) |
| *H01L 27/22* | (2006.01) |
| *H01L 43/02* | (2006.01) |
| *H01L 43/10* | (2006.01) |

(52) U.S. Cl.
CPC ........ *G11C 11/161* (2013.01); *G11C 11/1673* (2013.01); *G11C 11/1675* (2013.01); *H01F 10/325* (2013.01); *H01F 10/329* (2013.01); *H01F 10/3259* (2013.01); *H01F 10/3272* (2013.01); *H01L 27/222* (2013.01); *H01L 43/02* (2013.01); *H01L 43/10* (2013.01)

(58) Field of Classification Search
CPC .............. G11C 11/161; G11C 11/1673; G11C 11/1675; G11C 11/1693; G11C 11/18; H01F 10/325; H01F 10/3259; H01F 10/3272; H01F 10/329; H01F 10/1936; H01L 27/222; H01L 43/02; H01L 43/10; H01L 43/08
USPC .......................................... 365/158
See application file for complete search history.

(56) References Cited

U.S. PATENT DOCUMENTS

| | | | | |
|---|---|---|---|---|
| 9,831,423 | B2* | 11/2017 | Kondo | H01L 43/12 |
| 10,559,747 | B1* | 2/2020 | Li | G11C 11/18 |
| 2019/0189172 | A1* | 6/2019 | Higo | G11C 11/1659 |
| 2020/0006626 | A1* | 1/2020 | Smith | H01L 43/08 |

* cited by examiner

*Primary Examiner* — Fernando Hidalgo

(57) ABSTRACT

A magnetic structure includes a magnetic tunnel junction based on a synthetic antiferromagnetic free layer which is regulated by an electric field, and a spin-orbit layer located below the magnetic tunnel junction. The transformation from the antiferromagnetic coupling to the ferromagnetic coupling of the free layer based on a synthetic antiferromagnetic multilayer structure is controlled by an electric field. A spin-orbit torque magnetic random access memory, which includes the magnetic structure, is able to realize stable data writing under the combined interaction of electric field and current, and has advantages of simple structure for scaling, ultralow power consumption, ultrahigh speed of switching, radiation resistance and non-volatility.

12 Claims, 4 Drawing Sheets

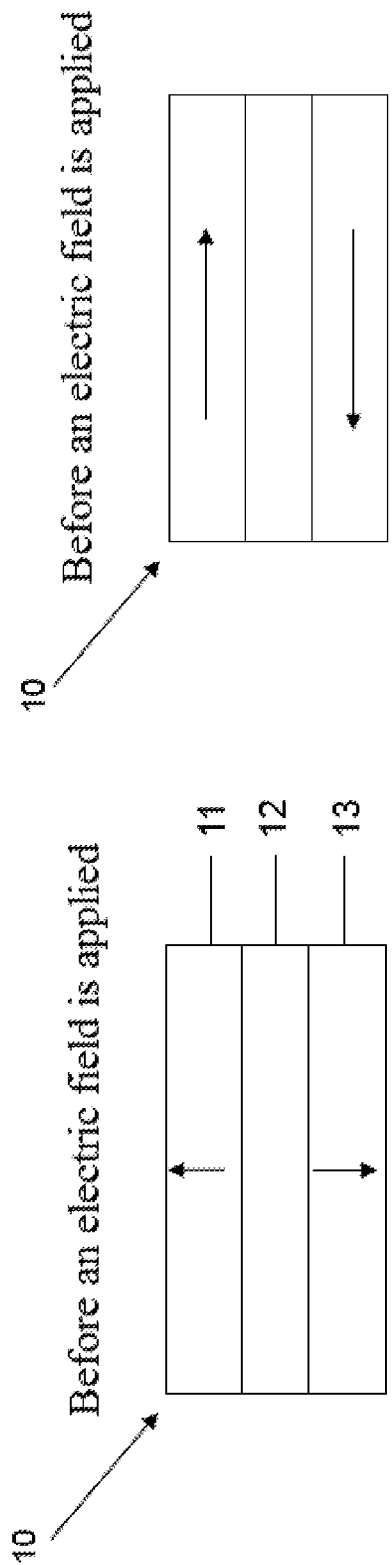
Fig. 1(a)
Fig. 1(c)
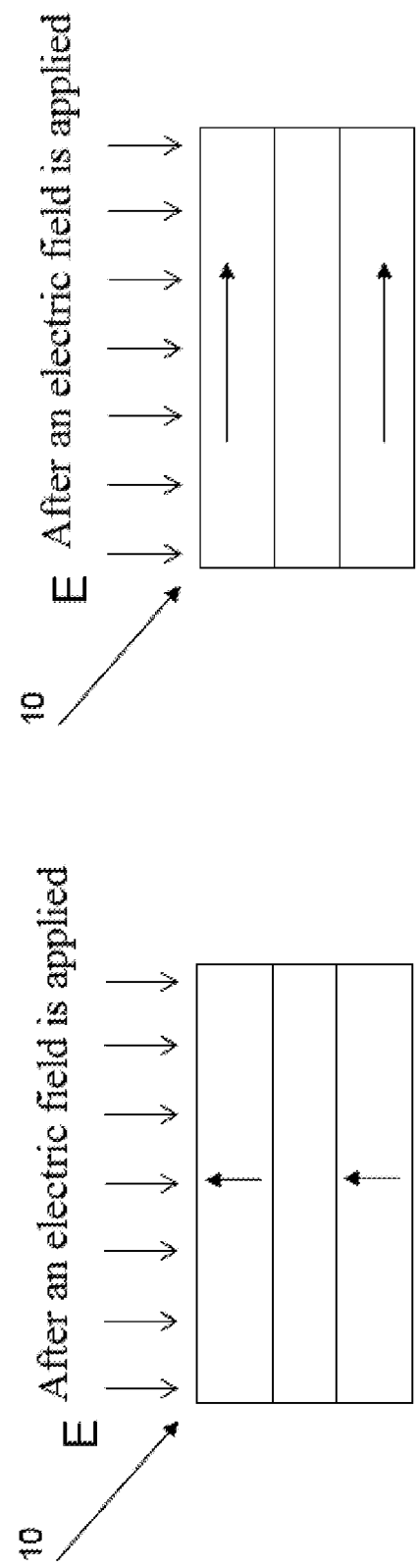
Fig. 1(b)
Fig. 1(d)

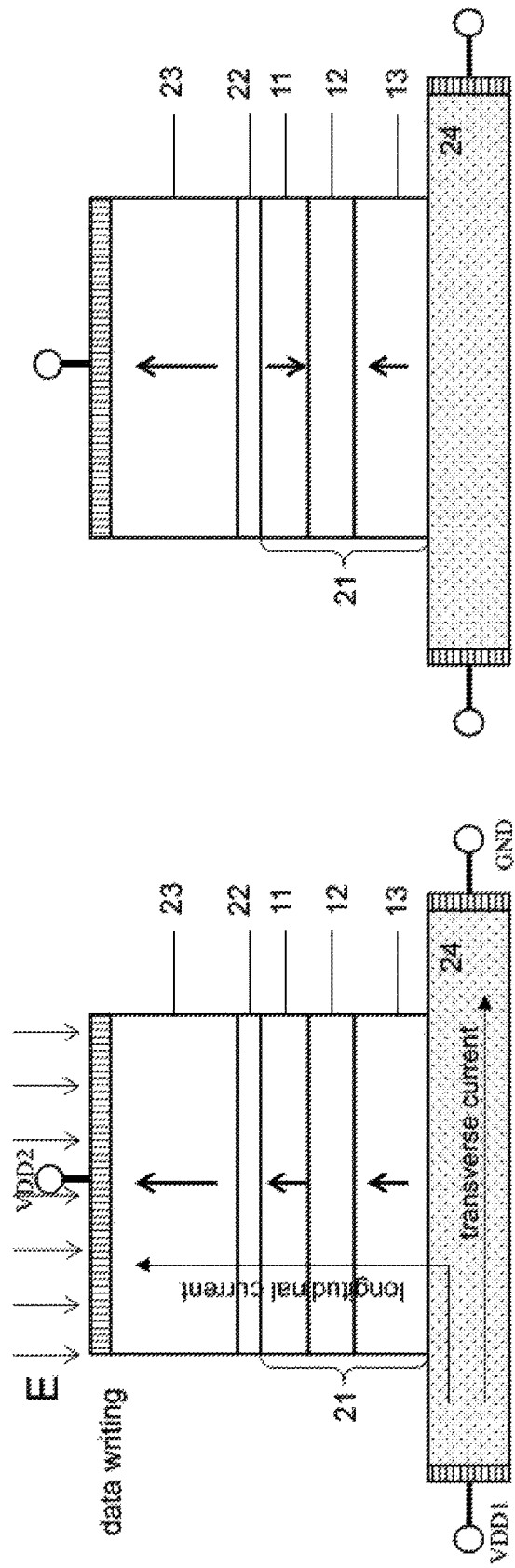
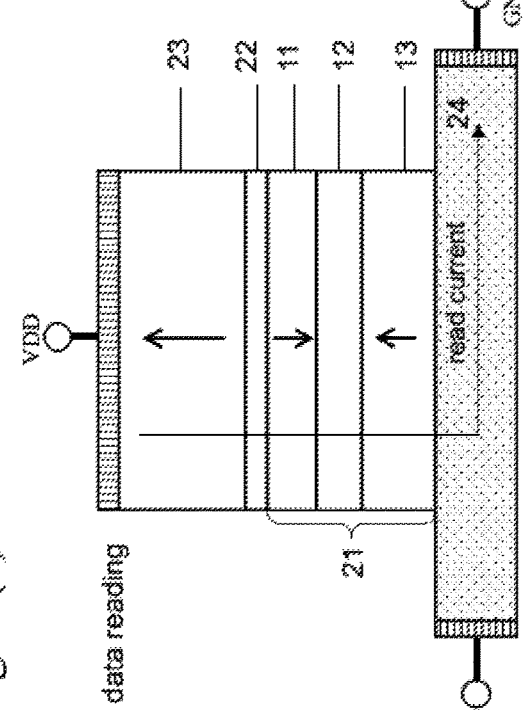
Fig. 4(a)
Fig. 4(b)
Fig. 4(c)

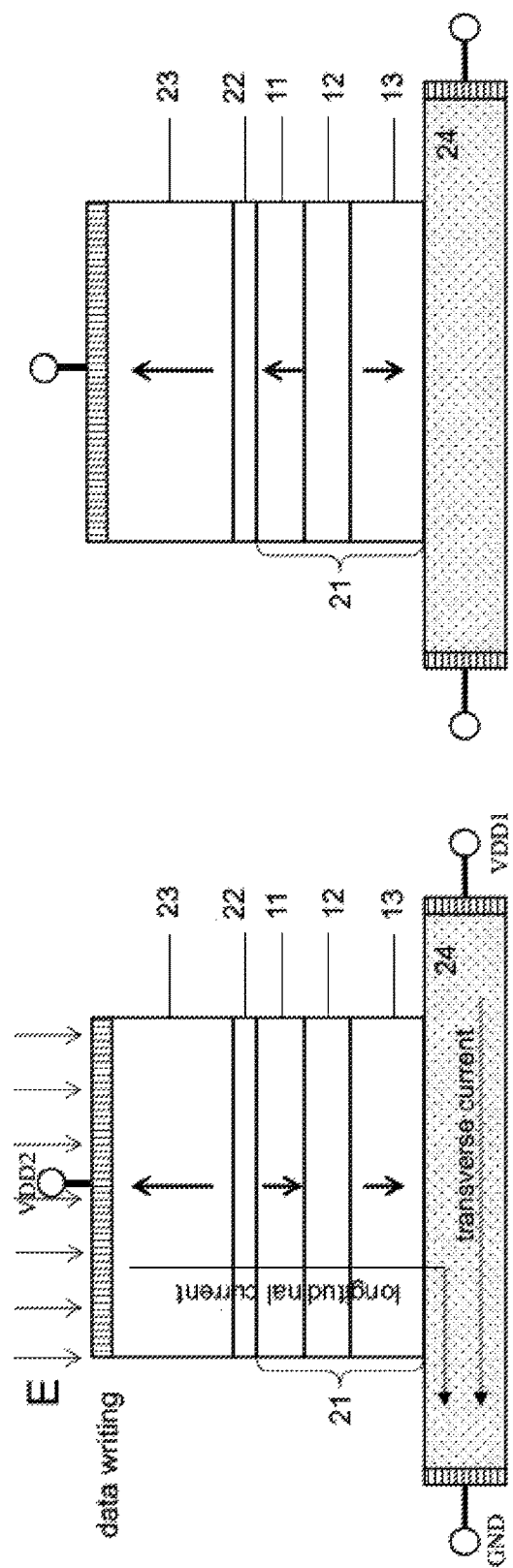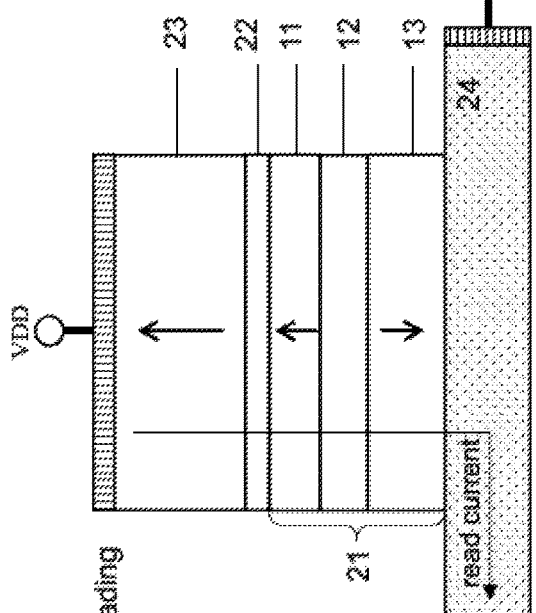
Fig. 5(a)
Fig. 5(b)
Fig. 5(c)

MAGNETIC STRUCTURE BASED ON SYNTHETIC ANTIFERROMAGNETIC FREE LAYER AND DERIVATIVE SOT-MRAM

CROSS REFERENCE OF RELATED APPLICATION

The present invention claims priority under 35 U.S.C. 119(a-d) to CN 201811088726.X, filed Sep. 18, 2018.

BACKGROUND OF THE PRESENT INVENTION

Field of Invention

The present invention relates to the circuits and devices having magnetic or ferromagnetic materials or structures and the applications thereof, and more particularly to a free layer based on a synthetic antiferromagnetic multilayer structure which is regulated by an electric field and a SOT-MRAM (Spin-orbit Torque Magnetic Random Access Memory) using a spin-orbit torque for data erasing.

Description of Related Arts

The MTJ (magnetic tunnel junction) comprises two magnetic metal layers and an ultra-thin insulation layer sandwiched between the two magnetic metal layers. If a bias voltage is applied between the two magnetic metal layers, the insulation layer is very thin, so electrons are able to pass through the potential barrier by the tunneling effect. Under a given bias voltage, the tunneling current and the tunneling resistance are determined by the relative magnetization direction (including parallel and antiparallel states which are respectively corresponding to a binary state "1" and a binary state "0") of two ferromagnetic layers, which is defined as TMR (tunneling magnetoresistance) effect. The relative magnetization direction of the two ferromagnetic layers is able to be changed by the applied magnetic field.

Compared with conventional MRAMs, the SOT-MRAM device utilizes the current-driven spin-orbit torque rather than the magnetic field generated by the current to switch the relative magnetization direction of the free layer and the fixed layer for achieving data writing; and at the same time, the SOT-MRAM device is not easily damaged at high current densities. However, the density of the critical switching current of current SOT-MRAMs is still high, which limits the density of MRAM cells in a memory array.

Therefore, it is necessary to provide a new type of SOT-MRAM based on a synthetic antiferromagnetic free layer which is regulated by an electric field, that is, an electric field is used to control a synthetic antiferromagnetic multilayer structure to change from an antiferromagnetic coupling to a ferromagnetic coupling, so that the synthetic antiferromagnetic multilayer structure acts as a free layer of the magnetic tunnel junction, so as to directly switch the relative magnetization direction of the free layer and the fixed layer combined with current to achieve data erasing, thereby reducing the density of write current, increasing the density of the memory cell array, and achieving ultralow power consumption of the memory cell.

SUMMARY OF THE PRESENT INVENTION

An object of the present invention is to provide a magnetic structure comprising a magnetic tunnel junction which comprises a free layer based on a synthetic antiferromagnetic multilayer structure and a spin-orbit layer, wherein the magnetic structure is applied to a SOT-MRAM (Spin-orbit Torque Magnetic Random Access Memory) with a lower density of a write current, so as to reduce a density of the write current, improve a density of MRAM cells in a memory array and achieve ultralow power consumption of the memory cell.

Another object of the present invention is to provide a SOT-MRAM (Spin-orbit Torque Magnetic Random Access Memory) based on a synthetic antiferromagnetic multilayer structure which acts as a free layer of the magnetic tunnel junction for assisting data writing by an electric field, thereby achieving ultrahigh speed of switching.

Another object of the present invention is to provide a write method of a read and write separated SOT-MRAM, which greatly reduces the impact of current density on the working life of MRAM, in order to achieve high endurance of a SOT-MRAM.

The present invention is achieved by technical solutions as follows.

A magnetic structure comprises a magnetic tunnel junction based on a synthetic antiferromagnetic free layer which is able to be regulated by an electric field, and a spin-orbit layer located below the magnetic tunnel junction.

Preferably, the magnetic tunnel junction comprises a free layer based on a synthetic antiferromagnetic multilayer structure, a fixed layer and a nonmagnetic barrier layer sandwiched between the fixed layer and the free layer, wherein a magnetization direction of the fixed layer and the free layer approximately points vertically out of a wafer surface or parallel to the wafer surface;

when the synthetic antiferromagnetic multilayer structure is in an antiferromagnetic coupling before an electric field is applied and has a diameter in a range of 1 nm to 100 nm; while being placed in an external electric field with a regulation voltage in a range of 0.1 V to 15 V, the synthetic antiferromagnetic multilayer structure transforms from an antiferromagnetic coupling to a ferromagnetic coupling; when the external electric field is removed, the synthetic antiferromagnetic multilayer structure transforms from the ferromagnetic coupling back to the antiferromagnetic coupling, that is, a transformation between the antiferromagnetic coupling and the ferromagnetic coupling of the synthetic antiferromagnetic multilayer structure is controlled by the external electric field.

Preferably, the free layer based on the synthetic antiferromagnetic multilayer structure comprises a first ferromagnetic layer, a second ferromagnetic layer and a nonmagnetic spacing layer sandwiched between the first ferromagnetic layer and the second ferromagnetic layer, wherein:

a magnetization direction of the first ferromagnetic layer and the second ferromagnetic layer points vertically out of a wafer surface or parallel to the wafer surface;

both the first ferromagnetic layer and the second ferromagnetic layer are made from but not limited to Fe, Co, CoFe, Ni, CoCrPt, CoFeB, $(Co/Ni)_p$, $(Co/Pd)_m$ or $(Co/Pt)_n$; m, n and p refer to a repeat number of stacked multilayers;

the nonmagnetic spacing layer is made from but not limited to at least one member selected from a group consisting of Nb, Ta, Cr, Mo, W, Re, Ru, Os, Rh, Ir, Pt, Cu, Ag and Au, and a thickness of the nonmagnetic spacing layer is in a range of 0.1 nm to 10 nm.

Preferably, the fixed layer is made from a ferromagnetic metal, a ferrimagnetic metal, a ferromagnetic metal alloy or a ferrimagnetic metal alloy; and is made from but not limited to Fe, Co, Ni, Mn, NiFe, FePd, FePt, CoFe, CoPd, CoPt, YCo, LaCo, PrCo, NdCo, SmCo, CoFeB, BiMn or NiMnSb, or a composite material of one of Fe, Co, Ni, Mn, NiFe, FePd, FePt, CoFe, CoPd, CoPt, YCo, LaCo, PrCo, NdCo, SmCo, CoFeB, BiMn and NiMnSb, and at least one of B, Al, Zr, Hf, Nb, Ta, Cr, Mo, Pd and Pt.

Preferably, the fixed layer is made from a synthetic ferromagnetic or ferrimagnetic material, and has a synthetic antiferromagnetic multilayer structure which is made from but not limited to Co/Ir, Co/Pt, Co/Pd, CoCr/Pt, Co/Au or Ni/Co and stacked by 3d/4d/4f/5d/5f/rare earth metal layer;

Preferably, the fixed layer is made from a semi-metallic ferromagnetic material which comprises a Heusler alloy in a form of XYZ or $X_2YZ$, wherein X is but not limited to at least one member selected from a group consisting of Mn, Fe, Co, Ni, Pd and Cu; Y is but not limited to at least one member selected from a group consisting of Ti, V, Cr, Mn, Fe, Co and Ni; Z is but not limited to at least one member selected from a group consisting of Al, Ga, In, Si, Ge, Sn and Sb.

Preferably, the fixed layer, which is made from a synthetic antiferromagnetic material, comprises a ferromagnetic sub-layer and a spacing sub-layer, wherein the ferromagnetic sub-layer is made from but not limited to Fe, Co, CoFe, Ni, CoCrPt, CoFeB, $(Co/Ni)_p$, $(Co/Pd)_m$ or $(Co/Pt)_n$, wherein m, n and p refer to a repeat number of stacked multilayers; the spacing sub-layer is made from but not limited to at least one member selected from a group consisting of Nb, Ta, Cr, Mo, W, Re, Ru, Os, Rh, Ir, Pt, Cu, Ag and Au.

Preferably, the nonmagnetic barrier layer is an insulated layer which is made from an oxide, nitride, or oxynitride material, wherein a component element of the oxide, nitride, or oxynitride material is but not limited to at least one member selected from a group consisting of Mg, B, Al, Ca, Sr, La, Ti, Hf, V, Ta, Cr, W, Ru, Cu, In, Si and Eu.

Preferably, the nonmagnetic barrier layer is a conductive layer which is made from a metal or alloy, and a component element thereof is but not limited to at least one member selected from a group consisting of Cu, Ag, Au, Al, Pt, Ta, Ti, Nb, Os, Ru, Rh, Y, Mg, Pd, Cr, W, Mo and V.

Preferably, the nonmagnetic barrier layer is made from but not limited to SiC, C or a ceramic material.

Preferably, the free layer is sandwiched between the spin-orbit layer and the nonmagnetic barrier layer, so that when a current is introduced into the spin-orbit layer, a magnetic moment of the free layer is flipped by a spin-orbit torque.

Preferably, the spin-orbit layer is made from a heavy metal material which is but not limited to at least one member selected from a group consisting of Y, Zr, Nb, Mo, Tc, Ru, Rh, Pd, Cd, In, Sb, Te, Hf, Ta, β-Ta, W, β-W, Re, Os, Ir, Pt, Au, Hg, Tl, Pb, Bi and Po.

Preferably, the spin-orbit layer is made from a topological insulation material which is but not limited to at least one member selected from a group consisting of CaTe, HgTe, CdTe, AlSb, InAs, GaSb, AlSB, $Bi_{1-x}Sb_x$, $Bi_2Se_3$, $Sb_2Te_3$, $Bi_2Te_3$, $Bi_2Te_2Se$, $(Bi,Sb)_2Te_3$, $Bi_{2-x}Sb_xTe_{3-y}Se_y$, $Sb_2Te_2Se$, $TlBiSe_2$, $TlBiTe_2$, $TlBi(S,Se)_2$, $PbBi_2Te_4$, $PbSb_2Te_4$, $GeBi_2Te_4$, $PbBi_4Te_7$, SnTe, $Pb_{1-x}Sn_xTe$, $Ag_2Te$, $SmB_6$, $Bi_{14}Rh_3I_9$, LuBiPt, DyBiPt, GdBiPt and $Nd_2(Ir_{1-x}Rh_x)_2O_7$.

Also, the present invention provides a SOT-MRAM (Spin-orbit Torque Magnetic Random Access Memory) based on a synthetic antiferromagnetic free layer, which comprises a magnetic structure, a first electrode, a second electrode, a third electrode, a fourth electrode, and an insulation layer, wherein:

the magnetic structure comprises a magnetic tunnel junction based on the synthetic antiferromagnetic free layer which is able to be regulated by an electric field and a spin-orbit layer located below the magnetic tunnel junction;

the magnetic tunnel junction comprises a fixed layer, a free layer, and a nonmagnetic barrier layer sandwiched between the fixed layer and the free layer, wherein the free layer is embodied as a synthetic antiferromagnetic multi-layer structure; the synthetic antiferromagnetic multilayer structure comprises a first ferromagnetic layer, a second ferromagnetic layer and a nonmagnetic spacing layer sandwiched between the first ferromagnetic layer and the second ferromagnetic layer; a magnetization direction of both the fixed layer and the free layer points vertically out of the wafer surface or parallel to the wafer surface;

the first electrode and the second electrode are respectively located at two ends of the spin-orbit layer, the third electrode and the fourth electrode are respectively located at an upper side of the fixed layer and a lower side of the insulation layer, the spin-orbit layer is sandwiched between the free layer and the insulation layer;

an electric field is generated by applying an external power source to the third electrode and the fourth electrode, so that a transformation between an antiferromagnetic coupling and a ferromagnetic coupling of the free layer is controlled by the electric field.

Preferably, every electrode is made from metal or alloy which is but not limited to at least one member selected from a group consisting of Li, Mg, Al, Ca, Sc, Ti, V, Mn, Cu, Zn, Ga, Ge, Sr, Y, Zr, Nb, Mo, Tc, Ru, Rh, Pd, Ag, Cd, In, Sn, Sb, Ba, Hf, Ta, W, Re, Os, Ir, Pt, Au, Tl, Pb, Bi, Po, La, Ce, Pr, Nd, Pm, Sm, Eu, Gd, Tb, Dy, Ho, Er, Tm and Yb.

Preferably, every electrode is made from a carbon-based conductive material which is but not limited to graphite, carbon nanotube or bamboo charcoal.

Also, the present invention provides a write method of the SOT-MRAM, which comprises steps of:

applying an electric field to the SOT-MRAM which transforms the free layer from an antiferromagnetic coupling to a ferromagnetic coupling and applying a transverse current to the spin-orbit layer; under an interplay between the electrical field and the transverse current, flipping a magnetic moment of the free layer, so as to write into a binary state "0" or "1"; after removing the electric field, transforming the free layer from the ferromagnetic coupling to the antiferromagnetic coupling, and completing writing into the binary state "0" or "1", wherein:

when the free layer is in the antiferromagnetic coupling, the magnetization direction of the first ferromagnetic layer and the magnetization direction of the second ferromagnetic layer are parallel in a reverse direction;

when the free layer is in the ferromagnetic coupling, the magnetization direction of the first ferromagnetic layer and the magnetization direction of the second ferromagnetic layer are parallel in a same direction.

Preferably, the transverse current is larger than a critical current jc, here, jc is in a range of $1 \times 10^2$ to $1 \times 10^7$ A/cm$^2$.

Preferably, the transverse current is a direct current.

Preferably, the interplay between the electrical field and the transverse current is achieved by applying an electric field pulse to the SOT-MRAM and applying a transverse current pulse to the spin-orbit layer at the same time; an overlap time $T_o$ between the electric field pulse and the transverse current pulse is allowed, so as to achieve the interplay between the electrical field and the transverse current; a range of the overlap time $T_o$ is described as $0 < T_o \leq 5$ ns; a pulse duration of the transverse current $T_{tr}$ is in a range of 0.1 ns to 5 ns; a pulse duration of the electric field $T_e$ is in a range of 0.05 ns to 10 ns.

Preferably, the interplay between the electrical field and the transverse current is achieved by applying an electric field pulse to the SOT-MRAM in advance and after a shift time $T_s$, applying a transverse current pulse to the spin-orbit layer; the shift time $T_s$ is allowed, in order to achieve an overlap time $T_o$ between the electric field pulse and the transverse current pulse, so as to achieve the interplay between the electrical field and the transverse current; the shift time $T_s$ is described as $T_s=\lambda T_e$, where $\lambda$ denotes a ratio of $T_s$ to $T_e$ and is described as $0<\lambda\leq 1$; a range of the overlap time $T_o$ is described as $0<T_o\leq 5$ ns; a pulse duration of the transverse current $T_{tr}$ is in a range of 0.1 ns to 5 ns; a pulse duration of the electric field $T_e$ is in a range of 0.05 ns to 10 ns.

Preferably, the interplay between the electrical field and the transverse current is achieved by applying a transverse current pulse to the spin-orbit layer in advance and after a shift time $T_s$, applying an electric field pulse to the SOT-MRAM; the shift time $T_s$ is allowed, in order to achieve an overlap time $T_o$ between the electric field pulse and the transverse current pulse, so as to achieve the interplay between the electrical field and the transverse current; the shift time $T_s$ is described as $T_s=\zeta T_{tr}$, where $\zeta$ denotes a ratio of $T_s$ to $T_{tr}$ and is described as $0<\zeta\leq 1$; a range of the overlap time $T_o$ is described as $0<T_o\leq 5$ ns; a pulse duration of the transverse current $T_{tr}$ is in a range of 0.1 ns to 5 ns; a pulse duration of the electric field $T_e$ is in a range of 0.05 ns to 10 ns.

Also, the present invention provides another write method of the SOT-MRAM, which comprises steps of:

applying a transverse current to the spin-orbit layer, a longitudinal auxiliary current to the magnetic tunnel junction and an electric field to the SOT-MRAM which transforms the free layer from an antiferromagnetic coupling to a ferromagnetic coupling; under an interplay between the electrical field, the transverse current and the longitudinal auxiliary current, flipping a magnetic moment of the free layer, so as to write into a binary state "0" or "1"; after removing the electric field, transforming the free layer from the ferromagnetic coupling to the antiferromagnetic coupling, and completing writing into the binary state "0" or "1", wherein:

when the free layer is in the antiferromagnetic coupling, the magnetization direction of the first ferromagnetic layer and the magnetization direction of the second ferromagnetic layer are parallel in a reverse direction;

when the free layer is in the ferromagnetic coupling, the magnetization direction of the first ferromagnetic layer and the magnetization direction of the second ferromagnetic layer are parallel in a same direction.

Preferably, the transverse current is lower than a critical current jc, here, jc is in a range of $1\times 10^2$ to $1\times 10^7$ A/cm$^2$.

Preferably, the longitudinal auxiliary current is in a range of $1\times 10^2$ to $1\times 10^7$ A/cm$^2$.

Preferably, the transverse current is a direct current, and the longitudinal auxiliary current is a direct current or an alternating current.

Preferably, the interplay between the electrical field, the transverse current and the longitudinal auxiliary current is achieved by applying a transverse current pulse to the spin-orbit layer, a longitudinal auxiliary current pulse to the magnetic tunnel junction and an electric field pulse to the SOT-MRAM with an overlap time $T_o$; a range of the overlap time $T_o$ is described as $0<T_o\leq 5$ ns; a pulse duration of the transverse current $T_{tr}$ is in a range of 0.1 ns to 5 ns; a pulse duration of the longitudinal auxiliary current $T_{lg}$ is in a range of 0.1 ns to 5 ns; a pulse duration of the electric field $T_e$ is in a range of 0.05 ns to 10 ns.

Compared with the prior art, the present invention has characteristics as follows. (1) Contrast to STT-MRAM (Spin-transfer Torque Magnetic Random Access Memory), the present invention has a lower critical switching density approximate in a range of $1\times 10^2$ to $1\times 10^7$ A/cm$^2$ while the magnetization flip critical switching current density of the STT-MRAM is about $1\times 10^7$ A/cm$^2$. (2) The transformation between the antiferromagnetic coupling and the ferromagnetic coupling of the synthetic antiferromagnetic multilayer structure is regulated by the electric field, so that the volume of the device is reduced significantly by reducing the thickness of the magnetic tunnel junction, so as to increase the density of MRAM cells in a memory array. (3) The structure of read-write separation helps to protect the magnetic structure from being damaged by high current density during frequent rewriting operations.

BRIEF DESCRIPTION OF THE DRAWINGS

The drawings described herein are provided to further understand the present invention, form a part of the present application, and are not intended to be a limitation of the present invention. In the drawings:

FIGS. 1(a)-(d) show a synthetic antiferromagnetic multilayer structure 10 which is able to be regulated by an electric field provided by the present invention.

FIG. 4(a) shows an intermediate process of writing a binary state "0" into the SOT-MRAM under an interaction of an electric field and a current.

FIG. 4(b) shows that after removing the electric field, the free layer 21 transforms from the ferromagnetic coupling to the antiferromagnetic coupling to write into the binary state "0".

FIG. 4(c) is a schematic diagram of reading data by the SOT-MRAM without electric field.

FIG. 5(a) shows an intermediate process of writing a binary state "1" into the SOT-MRAM under a combined interaction of an electric field and a current.

FIG. 5(b) shows that after removing the electric field, the free layer 21 transforms from the ferromagnetic coupling to the antiferromagnetic coupling to write into the binary state "1".

FIG. 5(c) is a schematic diagram of reading data by the SOT-MRAM without electric field.

DETAILED DESCRIPTION OF THE PREFERRED EMBODIMENT

Figure 2:
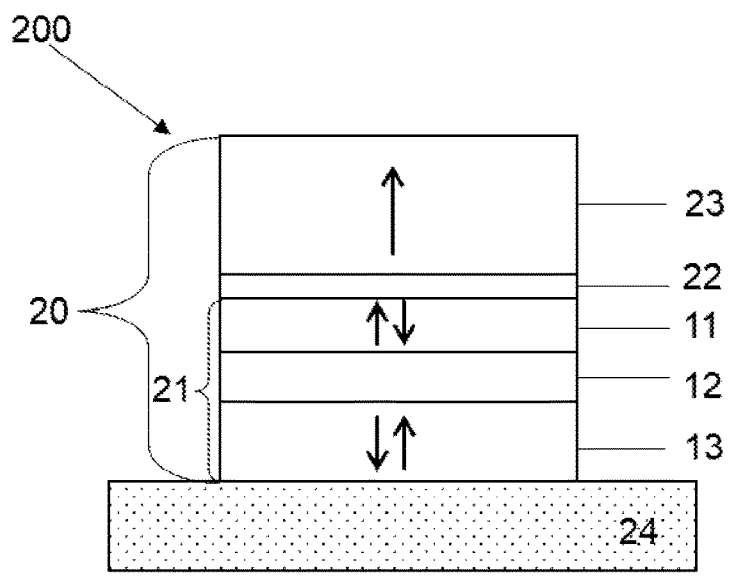
FIG. 2 is a structurally schematic view of a magnetic tunnel junction 200, which is not drawn on a scale with any other drawings of the present invention.

The technical solution of the present invention is described in detail with accompanying drawings and embodiments as follows, the following embodiments relate to a magnetic random access memory which is capable of controlling a synthetic antiferromagnetic multilayer structure to transform from an antiferromagnetic coupling to a ferromagnetic coupling by an electric field, but do not constitute a basis for any limitation of the present invention.

FIGS. 1(a)-(d) show a synthetic antiferromagnetic multilayer structure 10 which is able to be regulated by an electric field according to a preferred embodiment of the present invention. FIGS. 1(a)-(d) and any other drawings of the present invention are not drawn to scale. FIGS. 1(a)-(b) show a synthetic antiferromagnetic multilayer structure 10 with a magnetization direction approximately pointing vertically out of a wafer surface, FIGS. 1(c)-(d) show a synthetic antiferromagnetic multilayer structure 10 with a magnetization direction approximately parallel to the wafer surface. As shown in FIGS. 1(a)-(d), the synthetic antiferromagnetic multilayer structure 10 comprises a first ferromagnetic layer 11, a second ferromagnetic layer 13 and a nonmagnetic spacing layer 12 sandwiched between the first ferromagnetic layer 11 and the second ferromagnetic layer 13, wherein both the first ferromagnetic layer 11 and the second ferromagnetic layer 13 are made from but not limited to Fe, Co, CoFe, Ni, CoCrPt, CoFeB, $(Co/Ni)_p$, $(Co/Pd)_m$ or $(Co/Pt)_n$; m, n and p refer to a repeat number of stacked multilayers; the nonmagnetic spacing layer 12 is made from but not limited to at least one member selected from a group consisting of Nb, Ta, Cr, Mo, W, Re, Ru, Os, Rh, Ir, Pt, Cu, Ag and Au. Referring to FIGS. 1(a) and (c), the synthetic antiferromagnetic multilayer structure 10 is in an antiferromagnetic coupling before an electric field is applied and has a diameter in a range of 1 nm to 100 nm; when the synthetic antiferromagnetic multilayer structure 10 is placed in an external electric field with a regulation voltage in a range of 0.1 V to 15 V, referring to FIGS. 1(b) and (d), the synthetic antiferromagnetic multilayer structure 10 transforms from the antiferromagnetic coupling to a ferromagnetic coupling; when the external electric field is removed, the synthetic antiferromagnetic multilayer structure 10 transforms from the ferromagnetic coupling back to the antiferromagnetic coupling, that is, the transformation between the antiferromagnetic coupling and the ferromagnetic coupling is controlled by the external electric field. The electric field in the drawings is generated by another device, and is temporarily represented by a symbol E. A thickness of the nonmagnetic spacing layer 12 is in a range of 0.1 nm to 10 nm.

FIG. 2 is a structurally schematic view of a magnetic structure 200 which comprises a magnetic tunnel junction 20 based on a synthetic antiferromagnetic free layer 21 which is able to be regulated by an electric field and a spin-orbit layer 24 located below the magnetic tunnel junction 20.

The magnetic tunnel junction 20 comprises a free layer 21 based on the synthetic antiferromagnetic multilayer structure, a fixed layer 23 and a nonmagnetic barrier layer 22 sandwiched between the free layer 21 and the fixed layer 23. The free layer 21 is embodied as the synthetic antiferromagnetic multilayer structure mentioned above. Due to the antiferromagnetic coupling of the free layer 21, the magnetization direction of the first ferromagnetic layer 11 and the magnetization direction of the second ferromagnetic layer 13 are parallel in a reverse direction. A magnetization direction of the free layer 21 and the fixed layer 23 approximately points vertically out of the wafer surface or parallel to the wafer surface. Here, a case of pointing vertically out of the wafer surface is taken as an example.

The free layer 21 is sandwiched between the spin-orbit layer 24 and the nonmagnetic barrier layer 22, so that when a current is introduced into the spin-orbit layer 24, a magnetic moment of the free layer 21 is flipped by a spin-orbit torque.

According to the preferred embodiment of the present invention, the fixed layer 23 is made from a ferromagnetic metal, a ferrimagnetic metal, a ferromagnetic metal alloy or a ferrimagnetic metal alloy; and is made from but not limited to Fe, Co, Ni, Mn, NiFe, FePd, FePt, CoFe, CoPd, CoPt, YCo, LaCo, PrCo, NdCo, SmCo, CoFeB, BiMn or NiMnSb, or a composite material of one of Fe, Co, Ni, Mn, NiFe, FePd, FePt, CoFe, CoPd, CoPt, YCo, LaCo, PrCo, NdCo, SmCo, CoFeB, BiMn and NiMnSb, and at least one of B, Al, Zr, Hf, Nb, Ta, Cr, Mo, Pd and Pt.

According to the preferred embodiment of the present invention, both the fixed layer 23 and the free layer 21 are conductive.

According to other preferred embodiments of the present invention, the fixed layer 23 is made from a synthetic ferromagnetic or ferrimagnetic material, and has a synthetic antiferromagnetic multilayer structure which is made from but not limited to Co/Ir, Co/Pt, Co/Pd, CoCr/Pt, Co/Au or Ni/Co and stacked by 3d/4d/4f/5d/5f/rare earth metal layer;

Or the fixed layer 23 is made from a semi-metallic ferromagnetic material which comprises a Heusler alloy in a form of XYZ or $X_2YZ$, wherein X is but not limited to at least one member selected from a group consisting of Mn, Fe, Co, Ni, Pd and Cu; Y is but not limited to at least one member selected from a group consisting of Ti, V, Cr, Mn, Fe, Co and Ni; Z is but not limited to at least one member selected from a group consisting of Al, Ga, In, Si, Ge, Sn and Sb;

Or the fixed layer 23, which is made from a synthetic antiferromagnetic material, comprises a ferromagnetic sub-layer and a spacing sub-layer, wherein the ferromagnetic sub-layer is made from but not limited to Fe, Co, CoFe, Ni, CoCrPt, CoFeB, $(Co/Ni)_p$, $(Co/Pd)_m$ or $(Co/Pt)_n$, wherein m, n and p refer to a repeat number of stacked multilayers; the spacing sub-layer is made from but not limited to at least one member selected from a group consisting of Nb, Ta, Cr, Mo, W, Re, Ru, Os, Rh, Ir, Pt, Cu, Ag and Au.

According to the preferred embodiment of the present invention, the nonmagnetic barrier layer 22 is an insulated layer which made from an oxide, nitride, or oxynitride material, wherein a component element of the oxide, nitride, or oxynitride material is but not limited to at least one member selected from a group consisting of Mg, B, Al, Ca, Sr, La, Ti, Hf, V, Ta, Cr, W, Ru, Cu, In, Si and Eu.

According to other embodiments, the nonmagnetic barrier layer 22 is a conductive layer which is made from a metal or alloy, and a component element thereof is but not limited to at least one member selected from a group consisting of Cu, Ag, Au, Al, Pt, Ta, Ti, Nb, Os, Ru, Rh, Y, Mg, Pd, Cr, W, Mo and V.

According to other embodiments, the nonmagnetic barrier layer 22 is made from but not limited to SiC, C or a ceramic material.

According to other embodiments, the nonmagnetic barrier layer 22 is also able to have other structures. For example, U.S. Pat. No. 9,076,537 B2, titled by "Method and system for providing a magnetic tunneling junction using spin-orbit interaction based switching and memories utilizing the magnetic tunneling junction", discloses that a granular layer including conductive channels is added to an insulating matrix.

According to the above description, both the free layer 21 and the fixed layer 23, made from different materials, are ferromagnetic, and the nonmagnetic barrier layer 22 is non-magnetic.

According to the preferred embodiment of the present invention, the spin-orbit layer 24 is made from a heavy metal material which is but not limited to at least one member selected from a group consisting of Y, Zr, Nb, Mo, Tc, Ru, Rh, Pd, Cd, In, Sb, Te, Hf, Ta, β-Ta, W, β-W, Re, Os, Ir, Pt, Au, Hg, Tl, Pb, Bi and Po.

According to other embodiments, the spin-orbit layer 24 is made from a topological insulation material which is but not limited to at least one member selected from a group consisting of CaTe, HgTe, CdTe, AlSb, InAs, GaSb, AlSB, $Bi_{1-x}Sb_x$, $Bi_2Se_3$, $Sb_2Te_3$, $Bi_2Te_3$, $Bi_2Te_2Se$, $(Bi,Sb)_2Te_3$, $Bi_{2-x}Sb_xTe_{3-y}Se_y$, $Sb_2Te_2Se$, $TlBiSe_2$, $TlBiTe_2$, $TlBi(S,Se)_2$, $PbBi_2Te_4$, $PbSb_2Te_4$, $GeBi_2Te_4$, $PbBi_4Te_7$, SnTe, $Pb_{1-x}Sn_xTe$, $Ag_2Te$, $SmB_6$, $Bi_{14}Rh_3I_9$, LuBiPt, DyBiPt, GdBiPt and $Nd_2(Ir_{1-x}Rh_x)_2O_7$.

Figure 3:
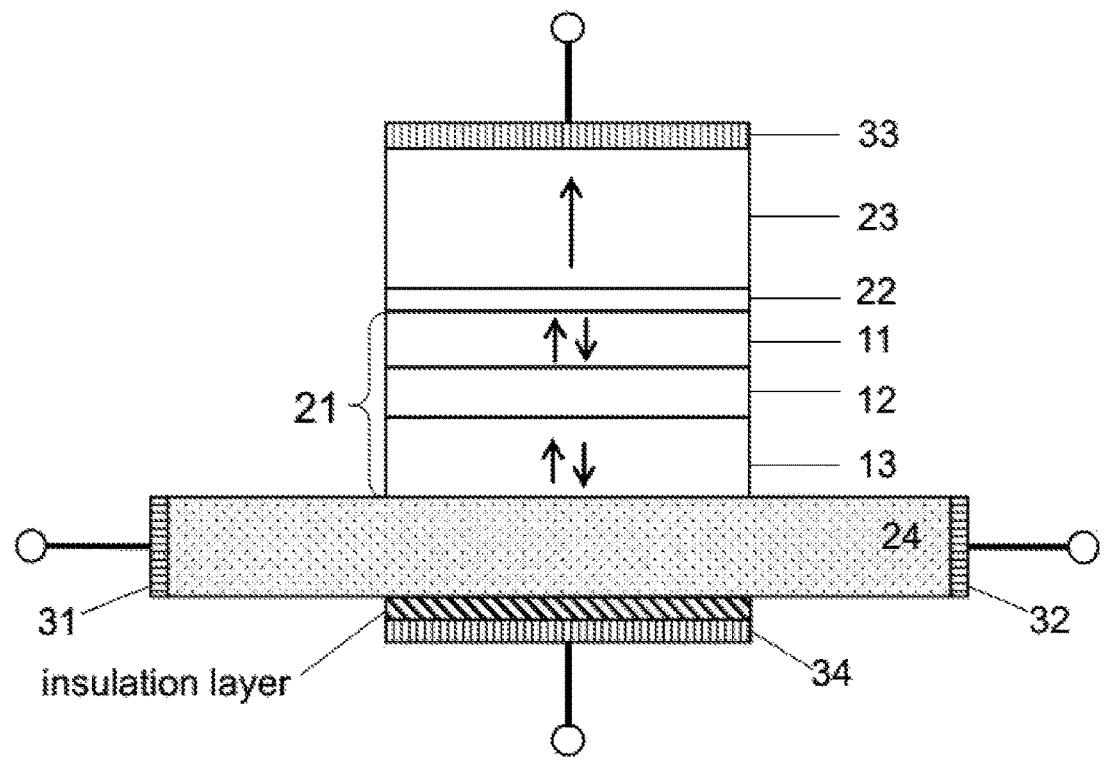
FIG. 3 is a structurally schematic view of a SOT-MRAM (Spin-orbit Torque Magnetic Random Access Memory) based on a synthetic antiferromagnetic free layer 21 which is able to be regulated by an electric field.

FIG. 3 is a structurally schematic view of a SOT-MRAM (Spin-orbit Torque Magnetic Random Access Memory) based on a synthetic antiferromagnetic free layer 21 which is able to be regulated by an electric field, which comprises a magnetic structure 200, electrodes 31, 32, 33, 34, and an insulation layer, wherein: the magnetic structure 200 comprises a magnetic tunnel junction 20 based on the synthetic antiferromagnetic free layer 21 and a spin-orbit layer 24 located below the magnetic tunnel junction 20; the magnetic tunnel junction 20 comprises a fixed layer 23, a free layer 21 based on a synthetic antiferromagnetic multilayer structure, and a nonmagnetic barrier layer 22 sandwiched between the fixed layer 23 and the free layer 21, wherein the free layer 21 is embodied as a synthetic antiferromagnetic multilayer structure; a magnetization direction of both the fixed layer 23 and the free layer 21 points vertically out of the wafer surface or parallel to the wafer surface, the transformation between the antiferromagnetic coupling and the ferromagnetic coupling of the synthetic antiferromagnetic multilayer structure is controlled by the external electric field.

A first electrode 31 and a second electrode 32 are respectively in contact with two ends of the spin-orbit layer 24, a third electrode 33 and a fourth electrode 34 are respectively in contact with an upper side of the fixed layer 23 and a lower side of the insulation layer, wherein the spin-orbit layer 24 is sandwiched between the free layer 21 and the insulation layer.

An electric field is generated by applying an external power source to the third electrode 33 and the fourth electrode 34, so that the transformation between the antiferromagnetic coupling and the ferromagnetic coupling of the free layer 21 is controlled by the electric field.

When writing is achieved by applying a transverse current to the spin-orbit layer 24 separately, a density of the transverse current is greater than a critical value $j_c$; when writing is achieved by simultaneously applying a transverse current to the spin-orbit layer 24 and applying a longitudinal auxiliary current to the magnetic tunnel junction 20, the density of the transverse current is lower than the critical value $j_c$, wherein $j_c$ is in a range of $1\times10^2$ to $1\times10^7$ A/cm$^2$, the transverse current is a direct current, and the longitudinal auxiliary current is a direct current or an alternating current.

According to the preferred embodiment of the present invention, every electrode is made from metal or alloy which is but not limited to at least one member selected from a group consisting of Li, Mg, Al, Ca, Sc, Ti, V, Mn, Cu, Zn, Ga, Ge, Sr, Y, Zr, Nb, Mo, Tc, Ru, Rh, Pd, Ag, Cd, In, Sn, Sb, Ba, Hf, Ta, W, Re, Os, Ir, Pt, Au, Tl, Pb, Bi, Po, La, Ce, Pr, Nd, Pm, Sm, Eu, Gd, Tb, Dy, Ho, Er, Tm and Yb.

According to other embodiments, every electrode is made from a carbon-based conductive material which is but not limited to graphite, carbon nanotube or bamboo charcoal.

FIG. 4(a) shows an intermediate process of writing a binary state "0" into the SOT-MRAM under an interplay between the electrical field, the transverse current and the longitudinal auxiliary current. Under the control of electric field E, the free layer 21 transforms from the antiferromagnetic coupling where the magnetization direction of the first ferromagnetic layer 11 and the magnetization direction of the second ferromagnetic layer 13 are parallel in a reverse direction to the ferromagnetic coupling where the magnetization direction of the first ferromagnetic layer 11 and the magnetization direction of the second ferromagnetic layer 13 are parallel in a same direction with the assistance of a transverse current applied to the spin-orbit layer 24 and a longitudinal auxiliary current applied to the magnetic tunnel junction 20 for data writing, so that a magnetic moment of the free layer 21 is flipped under the interplay between the electrical field, the transverse current and the longitudinal auxiliary current, so as to write into the binary state "0", wherein VDD1 and VDD2 are high level, VDD1 is larger than VDD2, GND is low level, the write current flows from VDD1, through the magnetic structure, and then out of VDD2 and GND. FIG. 4(b) shows that after removing the electric field, the free layer 21 transforms from the ferromagnetic coupling to the antiferromagnetic coupling to write into the binary state "0". FIG. 4(c) is a schematic diagram of reading data of the magnetic tunnel junction in one possible direction of current without electric field, wherein VDD is high level, GND is low level, the read current flows from VDD, through the magnetic structure, and then out of GND, and at this time, a relative magnetization direction of the ferromagnetic layer 11 is opposite to that of the fixed layer 23 to read out the current binary state "0".

FIG. 5(a) shows an intermediate process of writing a binary state "1" into the SOT-MRAM under an interplay between the electrical field, the transverse current and the longitudinal auxiliary current. Under the control of electric field E, the free layer 21 transforms from the antiferromagnetic coupling where the magnetization direction of the first ferromagnetic layer 11 and the magnetization direction of the second ferromagnetic layer 13 are parallel in a reverse direction to the ferromagnetic coupling where the magnetization direction of the first ferromagnetic layer 11 and the magnetization direction of the second ferromagnetic layer 13 are parallel in a same direction with the assistance of a transverse current applied to the spin-orbit layer 24 and a longitudinal auxiliary current applied to the magnetic tunnel junction 20 for data writing, so that a magnetic moment of the free layer 21 is flipped under the interplay between the electrical field, the transverse current and the longitudinal auxiliary current, so as to write into the binary state "1", wherein VDD1 and VDD2 are high level, VDD2 is larger than VDD1, GND is low level, the write current flows from VDD2, through the magnetic structure, and then out of VDD1 and GND. FIG. 5(b) shows that after removing the electric field, the free layer 21 transforms from the ferromagnetic coupling to the antiferromagnetic coupling to write into the binary state "1". FIG. 5(c) is a schematic diagram of reading data of the magnetic tunnel junction in one possible direction of current without electric field, wherein VDD is high level, GND is low level, the read current flows from VDD, through the magnetic structure, and then out of GND, and at this time, a relative magnetization direction of the ferromagnetic layer 11 is as same as that of the fixed layer 23 to read out the current binary state "1".

Based on the technical solutions disclosed by the present invention, those skilled in the art can make some substitutions and modifications to some of the technical features according to the disclosed technical contents without any creative work, and these substitutions and modifications are within the protective scope of the present invention.

What is claimed is:

1. A SOT-MRAM (Spin-orbit Torque Magnetic Random Access Memory), which comprises a magnetic structure, a first electrode, a second electrode, a third electrode, a fourth electrode, and an insulation layer, wherein:
the magnetic structure comprises a magnetic tunnel junction based on a synthetic antiferromagnetic multilayer structure and a spin-orbit layer located below the magnetic tunnel junction, wherein:
the magnetic tunnel junction with a diameter in a range of 1 nm to 100 nm comprises a free layer with the synthetic antiferromagnetic multilayer structure, a fixed layer and a nonmagnetic barrier layer sandwiched between the fixed layer and the free layer, wherein a magnetization direction of the fixed layer and the free layer points vertically out of a wafer surface or parallel to the wafer surface; the free layer with the synthetic antiferromagnetic multilayer structure comprises a first ferromagnetic layer, a second ferromagnetic layer and a nonmagnetic spacing layer sandwiched between the first ferromagnetic layer and the second ferromagnetic layer, wherein a magnetization direction of the first ferromagnetic layer and the second ferromagnetic layer points vertically out of the wafer surface or parallel to the wafer surface;
the first electrode and the second electrode are respectively located at two ends of the spin-orbit layer, the third electrode and the fourth electrode are respectively located at an upper side of the fixed layer and a lower side of the insulation layer, the spin-orbit layer is sandwiched between the free layer and the insulation layer;
whereby when an external power source is applied to the third electrode and the fourth electrode with a regulation voltage in a range of 0.1 V to 15 V, an electric field is generated, in such a manner that a transformation between an antiferromagnetic coupling and a ferromagnetic coupling of the free layer is controlled by the electric field, so that a magnetization direction of the free magnetic layer is regulated by interplay between a current and the electric field.

2. The SOT-MRAM, as recited in claim 1, wherein:
both the first ferromagnetic layer and the second ferromagnetic layer are made from Fe, Co, CoFe, Ni, CoCrPt, CoFeB, $(Co/Ni)_p$, $(Co/Pd)_m$ or $(Co/Pt)_n$; m, n and p refer to a repeat number of stacked multilayers; the nonmagnetic spacing layer is made from at least one member selected from a group consisting of Nb, Ta, Cr, Mo, W, Re, Ru, Os, Rh, Ir, Pt, Cu, Ag and Au, and a thickness of the nonmagnetic spacing layer is in a range of 0.1 nm to 10 nm.

3. The SOT-MRAM, as recited in claim 1, wherein:
the fixed layer is made from a ferromagnetic metal, a ferrimagnetic metal, a ferromagnetic metal alloy or a ferrimagnetic metal alloy; and is made from Fe, Co, Ni, Mn, NiFe, FePd, FePt, CoFe, CoPd, CoPt, YCo, LaCo, PrCo, NdCo, SmCo, CoFeB, BiMn or NiMnSb, or a composite material of one of Fe, Co, Ni, Mn, NiFe, FePd, FePt, CoFe, CoPd, CoPt, YCo, LaCo, PrCo, NdCo, SmCo, CoFeB, BiMn and NiMnSb, and at least one of B, Al, Zr, Hf, Nb, Ta, Cr, Mo, Pd and Pt;
or, the fixed layer is made from a synthetic ferromagnetic or ferromagnetic material, and has a synthetic multilayer structure which is made from Co/Ir, Co/Pt, Co/Pd, CoCr/Pt, Co/Au or Ni/Co and stacked by 3d/4d/4f/5d/5f/rare earth metal layer;
or, the fixed layer is made from a semi-metallic ferromagnetic material which comprises a Heusler alloy in a form of XYZ or $X_2YZ$, wherein X is at least one member selected from a group consisting of Mn, Fe, Co, Ni, Pd and Cu; Y is at least one member selected from a group consisting of Ti, V, Cr, Mn, Fe, Co and Ni; Z is at least one member selected from a group consisting of Al, Ga, In, Si, Ge, Sn and Sb;
or, the fixed layer, which is made from a synthetic antiferromagnetic material, comprises a ferromagnetic sub-layer and a spacing sub-layer, wherein the ferromagnetic sub-layer is made from Fe, Co, CoFe, Ni, CoCrPt, CoFeB, $(Co/Ni)_p$, $(Co/Pd)_m$ or $(Co/Pt)_n$, wherein m, n and p refer to a repeat number of stacked multilayers; the spacing sub-layer is made from at least one member selected from a group consisting of Nb, Ta, Cr, Mo, W, Re, Ru, Os, Rh, Ir, Pt, Cu, Ag and Au.

4. The SOT-MRAM, as recited in claim 1, wherein:
the nonmagnetic barrier layer is an insulated layer which is made from an oxide, nitride, or oxynitride material, wherein a component element of the oxide, nitride, or oxynitride material is at least one member selected from a group consisting of Mg, B, Al, Ca, Sr, La, Ti, Hf, V, Ta, Cr, W, Ru, Cu, In, Si and Eu;
or, the nonmagnetic barrier layer is a conductive layer which is made from a metal or alloy, and a component element thereof is at least one member selected from a group consisting of Cu, Ag, Au, Al, Pt, Ta, Ti, Nb, Os, Ru, Rh, Y, Mg, Pd, Cr, W, Mo and V;
or, the nonmagnetic barrier layer is made from SiC, C or a ceramic material.

5. The SOT-MRAM, as recited in claim 1, wherein:
the free layer is sandwiched between the spin-orbit layer and the nonmagnetic barrier layer, so that when a current is introduced into the spin-orbit layer, a magnetic moment of the free layer is flipped by a spin-orbit torque.

6. The SOT-MRAM, as recited in claim 1, wherein:
the spin-orbit layer is made from a heavy metal material which is at least one member selected from a group consisting of Y, Zr, Nb, Mo, Tc, Ru, Rh, Pd, Cd, In, Sb, Te, Hf, Ta, β-Ta, W, β-W, Re, Os, Ir, Pt, Au, Hg, Tl, Pb, Bi and Po;
or, the spin-orbit layer is made from a topological insulation material which is at least one member selected from a group consisting of CaTe, HgTe, CdTe, AlSb, InAs, GaSb, AlSB, $Bi_2Se_3$, $Sb_2Te_3$, $Bi_2Te_3$, $Bi_2Te_2Se$, $(Bi,Sb)_2Te_3$, $Sb_2Te_2Se$, $TlBiSe_2$, $TlBiTe_2$, $TlBi(S,Se)_2$, $PbBi_2Te_4$, $PbSb_2Te_4$, $GeBi_2Te_4$, $PbBi_4Te_7$, SnTe, $Pb_{1-x}Sn_xTe$, $Ag_2Te$, $SmB_6$, $Bi_{1-4}Rh_3I_9$, LuBiPt, DyBiPt, GdBiPt and $Nd_2(Ir_{1-x}Rh_x)_2O_7$.

7. The SOT-MRAM, as recited in claim 5, wherein:
the spin-orbit layer is made from a heavy metal material which is at least one member selected from a group consisting of Y, Zr, Nb, Mo, Tc, Ru, Rh, Pd, Cd, In, Sb, Te, Hf, Ta, β-Ta, W, β-W, Re, Os, Ir, Pt, Au, Hg, Tl, Pb, Bi and Po;
or, the spin-orbit layer is made from a topological insulation material which is at least one member selected from a group consisting of CaTe, HgTe, CdTe, AlSb, InAs, GaSb, AlSB, $Bi_2Se_3$, $Sb_2Te_3$, $Bi_2Te_3$, $Bi_2Te_2Se$, $(Bi,Sb)_2Te_3$, $Sb_2Te_2Se$, $TlBiSe_2$, $TlBiTe_2$, $TlBi(S,Se)_2$, $PbBi_2Te_4$, $PbSb_2Te_4$, $GeBi_2Te_4$, $PbBi_4Te_7$, SnTe, $Pb_{1-x}Sn_xTe$, $Ag_2Te$, $SmB_6$, $Bi_{1-4}Rh_3I_9$, LuBiPt, DyBiPt, GdBiPt and $Nd_2(Ir_{1-x}Rh_x)_2O_7$.

8. The SOT-MRAM, as recited in claim 1, wherein:
each of the first electrode, the second electrode, the third electrode and the fourth electrode is made from metal or alloy which is at least one member selected from a group consisting of Li, Mg, Al, Ca, Sc, Ti, V, Mn, Cu, Zn, Ga, Ge, Sr, Y, Zr, Nb, Mo, Tc, Ru, Rh, Pd, Ag, Cd, In, Sn, Sb, Ba, Hf, Ta, W, Re, Os, Ir, Pt, Au, Tl, Pb, Bi, Po, La, Ce, Pr, Nd, Pm, Sm, Eu, Gd, Tb, Dy, Ho, Er, Tm and Yb;

or each of the first electrode, the second electrode, the third electrode and the fourth electrode is made from a carbon-based conductive material which is graphite, carbon nanotube or bamboo charcoal.

9. A write method of the SOT-MRAM (Spin-orbit Torque Magnetic Random Access Memory) as recited in claim 1, which comprises steps of:

applying an electric field to the SOT-MRAM which transforms the free layer from an antiferromagnetic coupling to a ferromagnetic coupling and applying a transverse current to the spin-orbit layer; under an interplay between the electrical field and the transverse current, flipping a magnetic moment of the free layer, so as to write into a binary state "0" or "1"; after removing the electric field, transforming the free layer from the ferromagnetic coupling to the antiferromagnetic coupling, and completing writing into the binary state "0" or "1", wherein:

when the free layer is in the antiferromagnetic coupling, the magnetization direction of the first ferromagnetic layer and the magnetization direction of the second ferromagnetic layer are parallel in a reverse direction;

when the free layer is in the ferromagnetic coupling, the magnetization direction of the first ferromagnetic layer and the magnetization direction of the second ferromagnetic layer are parallel in a same direction;

the transverse current is larger than a critical current jc, here, jc is in a range of $1\times10^2$ to $1\times10^7$ A/cm$^2$;

the transverse current is a direct current.

10. The write method, as recited in claim 9, wherein:

the interplay between the electrical field and the transverse current is achieved by applying an electric field pulse to the SOT-MRAM and applying a transverse current pulse to the spin-orbit layer at the same time; an overlap time $T_o$ between the electric field pulse and the transverse current pulse is allowed, so as to achieve the interplay between the electrical field and the transverse current; a range of the overlap time $T_o$ is described as $0<T_o\leq5$ ns;

or the interplay between the electrical field and the transverse current is achieved by applying an electric field pulse to the SOT-MRAM in advance and after a shift time $T_s$, applying a transverse current pulse to the spin-orbit layer; the shift time $T_s$ is allowed, in order to achieve an overlap time $T_o$ between the electric field pulse and the transverse current pulse, so as to achieve the interplay between the electrical field and the transverse current; the shift time $T_s$ is described as $T_s=\lambda T_e$, where $\lambda$ denotes a ratio of $T_s$ to $T_e$ and is described as $0<\lambda\leq1$; a range of the overlap time $T_o$ is described as $0<T_o\leq5$ ns;

or the interplay between the electrical field and the transverse current is achieved by applying a transverse current pulse to the spin-orbit layer in advance and after a shift time $T_s$, applying an electric field pulse to the SOT-MRAM; the shift time $T_s$ is allowed, in order to achieve an overlap time $T_o$ between the electric field pulse and the transverse current pulse, so as to achieve the interplay between the electrical field and the transverse current; the shift time $T_s$ is described as $T_s=\zeta T_{tr}$, where $\zeta$ denotes a ratio of $T_s$ to $T_{tr}$ and is described as $0<\zeta\leq1$; a range of the overlap time $T_o$ is described as $0<T_o\leq5$ ns;

a pulse duration of the transverse current $T_{tr}$ is in a range of 0.1 ns to 5 ns;

a pulse duration of the electric field $T_e$ is in a range of 0.05 ns to 10 ns.

11. A write method of the SOT-MRAM (Spin-orbit Torque Magnetic Random Access Memory) as recited in claim 1, which comprises steps of:

applying a transverse current to the spin-orbit layer, a longitudinal auxiliary current to the magnetic tunnel junction and an electric field to the SOT-MRAM which transforms the free layer from an antiferromagnetic coupling to a ferromagnetic coupling; under an interplay between the electrical field, the transverse current and the longitudinal auxiliary current, flipping a magnetic moment of the free layer, so as to write into a binary state "0" or "1"; after removing the electric field, transforming the free layer from the ferromagnetic coupling to the antiferromagnetic coupling, and completing writing into the binary state "0" or "1", wherein:

when the free layer is in the antiferromagnetic coupling, the magnetization direction of the first ferromagnetic layer and the magnetization direction of the second ferromagnetic layer are parallel in a reverse direction;

when the free layer is in the ferromagnetic coupling, the magnetization direction of the first ferromagnetic layer and the magnetization direction of the second ferromagnetic layer are parallel in a same direction;

the transverse current is lower than a critical current jc, here, jc is in a range of $1\times10^2$ to $1\times10^7$ A/cm$^2$;

the longitudinal auxiliary current is in a range of $1\times10^2$ to $1\times10^7$ A/cm$^2$;

the transverse current is a direct current, and the longitudinal auxiliary current is a direct current or an alternating current.

12. The write method, as recited in claim 11, wherein:

the interplay between the electrical field, the transverse current and the longitudinal auxiliary current is achieved by applying a transverse current pulse to the spin-orbit layer, a longitudinal auxiliary current pulse to the magnetic tunnel junction and an electric field pulse to the SOT-MRAM with an overlap time $T_o$; a range of the overlap time $T_o$ is described as $0<T_o\leq5$ ns;

a pulse duration of the transverse current $T_{tr}$ is in a range of 0.1 ns to 5 ns;

a pulse duration of the longitudinal auxiliary current $T_{lg}$ is in a range of 0.1 ns to 5 ns;

a pulse duration of the electric field $T_e$ is in a range of 0.05 ns to 10 ns.

* * * * *